(12) United States Patent
Currie

(10) Patent No.: US 6,771,201 B1
(45) Date of Patent: Aug. 3, 2004

(54) HYBRID PHOTONIC ANALOG TO DIGITAL CONVERTER USING SUPERCONDUCTING ELECTRONICS

(75) Inventor: Marc Currie, Arlington, VA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 10/350,189

(22) Filed: Jan. 24, 2003

(51) Int. Cl.[7] ................................................ H03M 1/12
(52) U.S. Cl. ...................................... 341/155; 341/137
(58) Field of Search ................................ 341/137, 155; 702/86

(56) References Cited

U.S. PATENT DOCUMENTS 4,694,276 A * 9/1987 Rastegar ...................... 341/137
4,933,888 A * 6/1990 Bloyet et al. .................. 702/86

OTHER PUBLICATIONS

Currie, "High–Speed, photonic ADC using phase modulation", IEEE, May 6–11, 2001, pp. 68–69.*
Przybysz et al., "Jospehson sigma delta modulator for high dynamic range ADC", IEEE, Aug. 24, 1992, pp. 2732–2735.*
Hasegawa et al., "A DC–Powered Josephson Logic Family That uses Hybrid Unlatching Flip–Flop Logic Elements", IEEE Transastions on Applied Superconductivity, vol. 5, No. 4, Dec. 4, 1995.*
Clark et al., "Time and Wavelength–interweaved photonic sampler ADC", IEEE, May 23–28, 1999, pp. 169–170.*
W. Ng. Et al., "Photonics Technologies For ADC at GHz Sampling Rates", IEEE, 2000, pp. 200–201.*

* cited by examiner

*Primary Examiner*—Jean Bruner Jeanglaude
(74) *Attorney, Agent, or Firm*—John J. Karasek; John Gladstone Mills, III

(57) ABSTRACT

This invention discloses a hybrid photonic analog-to-digital converter using superconducting electronics to achieve a high-speeds. This scheme differs from most current designs by combining two systems, photonic and superconducting, to utilize each system for optimal performance. The photonic system performs the optical sampling of the signal with very low aperture and jitter errors. This optically sampled data is then converted to an electronic signal via an optoelectronic switch and quantized in the superconducting system. The high-speed (>100 GHz) superconducting electronic system transforms the quantized signal into a binary output. This invention allows for analog-to-digital conversion at much higher speeds than available with current electronic analog-to-digital converters.

12 Claims, 4 Drawing Sheets

| I | I/2(A0) | MSB I/4(A1) | NLSB B1 | LSB B0 |
|---|---|---|---|---|
| 9 | 4 | | | |
| 8 | 4 | | | |
| 7 | 3 | 1 | 1 | 1 |
| 6 | 3 | 1 | 1 | 0 |
| 5 | 2 | 1 | 0 | 1 |
| 4 | 2 | 1 | 0 | 0 |
| 3 | 1 | 0 | 1 | 1 |
| 2 | 1 | 0 | 1 | 0 |
| 1 | 0 | 0 | 0 | 1 |
| 0 | 0 | 0 | 0 | 0 |

BINARY OUTPUT

HYBRID PHOTONIC ANALOG TO DIGITAL CONVERTER USING SUPERCONDUCTING ELECTRONICS

BACKGROUND OF THE INVENTION

1. Field of the Invention

The invention is concerned with the use of superconducting electronics with a hybrid photonic analog to digital converter to achieve high conversion speeds. The invention differs from most current designs by combining two systems, photonic and superconducting, to utilize each system for optimal performance.

2. Description of the Related Prior Art

Electronic analog-to-digital converter (ADC) has evolved into several different architectures. Today's popular high-speed flash ADCs interleave parallel channels of sampling and comparing circuits to increase their effective speed by the number of parallel channels (See M. J. Demler, High Speed analog to digital conversion. San Diego: *Academic Press*, 1991.) The pursuit of even higher speeds along with the limitations of traditional electronic techniques has drawn the superconducting electronics and the photonic communities into this arena. Superconducting electronics combine two important properties for analog-to-digital conversion: quantization and high-speed Josephson digital electronics. Photonic systems lend themselves to ADCs with their large bandwidths and low-noise operation, and can be directly substituted for their electronic counterparts, improving the integrated system and extending the overall performance.

The concept of a photonic ADC spans more than two decades (See H. F. Taylor, "An optical analog-to-digital converter-design and analysis," *IEEE J Quantum Electron.*, vol. QE-15, pp. 210–16, 1979; see also :R. A. Becker, C. E. Woodward, F. J. Leonberger, and R. C. Williamson, "Wideband electrooptic guided-wave analog-to-digital converters," *Proc. IEEE*, vol. 72, pp. 802–19, 1984; see also S. Bhushan, F. Coppinger, and B. Jalali, "Time-stretched analogue-to-digital conversion," *Electron. Lett.*, vol. 34, pp. 1081–3, 1998; see also T. R. Clark, J. U. Kang, and R. D. Esman, "Performance of a time-and wavelength-interleaved photonic sampler for analog-digital conversion," *IEEE Photon. Technol. Lett.*, vol. 11, pp. 1168–70, 1999; and also by this inventor, M. Currie, T. R. Clark, and P. J. Matthews, "Photonic analog-to-digital conversion by distributed phase modulation," *IEEE Photon. Technol Lett.*, vol. 12, pp. 1689–91, 2000.

Mode-locked lasers employed in photonic ADCs enhance the system by providing picosecond and sub-picosecond sampling of the electronic waveform in an electro-optic device. Photonic sampling functions either as a high-speed, photonic sample-and-hold circuit or as a pre-sampler for an electronic sample-and-hold circuit. A second major attribute of photonic systems also arises from the mode-locked laser source in which the extremely precise timing characteristics of mode-locked lasers serve as an optical clock. Phase noise measurements of such laser systems have exhibited a timing jitter of less than 10 fs for a 10-GHz clock (See T. R. Clark, T. F. Carruthers, P. J. Matthews, and I. N. Duling, III, "Phase noise measurements of ultrastable 10 GHz harmonically modelocked fibre laser," *Electron. Lett.*, vol. 35, pp. 720–1, 1999).

Superconducting ADCs also enjoy a long history with designs for parallel (flash) and serial (sigma-delta, counting, etc.) ADCs. (See C. A. Hamilton, F. L. Lloyd, and R. L. Kautz, "Superconducting A/D converter using latching comparators," *IEEE Trans. Mag.*, vol. MAG-21, pp. 197–9, 1985; G. S. Lee and D. A. Peterson, "Superconductive A/D converters," *Proc. IEEE*, vol.77, pp.1264–73, 1989; S. V. Rylov, L. A. Bunz, D. V. Gaidarenko, M. A. Fisher, R. P. Robertazzi, and O. A. Mukhanov, "High resolution ADC system," *IEEE Trans. Appl. Supercond.*, vol. 7, pp. 2649–52, 1997; S. B. Kaplan, P. D. Bradley, D. K. Brock, D. Gaidarenko, D. Gupta, W. Q. Li, and S. V. Rylov, "A superconductive flash digitizer with on-chip memory," *IEEE Trans. Appl. Supercond.*, vol. 9, pp. 3020–3025, 1999.)

These converters run the gamut from high-resolution to high-speed. Superconducting ADCs are particularly attractive due to their low power requirements and high-speed operation. Optical coupling to superconducting electronics allows good thermal isolation while also enabling a high-speed interface.

SUMMARY OF THE INVENTION

An object of this invention is to provide a hybrid analog to digital converter that uses superconducting electronics with a photonic system to achieve high conversion speeds.

Another object of this invention is for the photonic system to provide optical sampling of the signal with very low aperture and jitter errors.

Another object of this invention is for the optically sampled data to be converted into an electronic signal via an optoelectronic switch.

Another object of the invention is for the converted electronic signal to be quantized by a superconducting system.

Another object of the invention is that the high resolution sampling is provided in the photonic system and not in the superconducting electronics.

Another object of the invention is to provide superconducting quantization of modulated optical pulse trains.

Another object of the invention is to provide an analog to digital converter with a low optical power level of 2 mW at 100 GHz operating speed.

Another object of the invention is that any pulsed laser system can be used and any type of superconducting logic can be used, and any optoelectronic switch can be used to convert the optical pulse train into an electrical pulse train.

DESCRIPTION OF THE PREFERRED EMBODIMENT

The present invention is directed to an innovative solution that provides for the conversion of analog signals to digital signals using a combination of superconducting electronics and photonic. The present invention adopts mode-locked lasers and electro-optic modulation techniques along with superconducting quantization and high-speed Josephson electronics to perform analog-to-digital conversion of an input signal, wherein the clock and sampling of the analog-to-digital conversion system is performed within the optical system while the quantization, digitization, and output of the analog-to-digital converter are performed in the superconducting electronics subsystem. This system optimally utilizes the individual strengths each subsystem (photonic and superconducting electronics) to overcome the weaknesses of other subsystems, thereby achieving unmatched performance.

In one aspect, the present invention is directed to a photonic sampling system that includes a mode-locked optical source capable of producing optical pulse trains of picosecond pulses at high repetition rates. The repetition rate of this laser is increased (if necessary) by sending the optical pulse train into a multiplexing module such as a time-domain multiplexer. This establishes an ultra-stabile optical clocking system for the analog-to-digital converter. An electro-optic modulator is used to impress the input electrical signal onto the optical pulse train. Upon passing through the electro-optic modulator, the optical pulse train samples the electrical waveform with a temporal window defined primarily by the optical pulse width. This enables much shorter time apertures than are available in conventional electronic converters. Having optically sampled the electrical waveform, the optical signal is converted back to an electrical signal via a high-speed photodetector for quantization and processing by the superconducting electronics subsystem.

Figure 1:
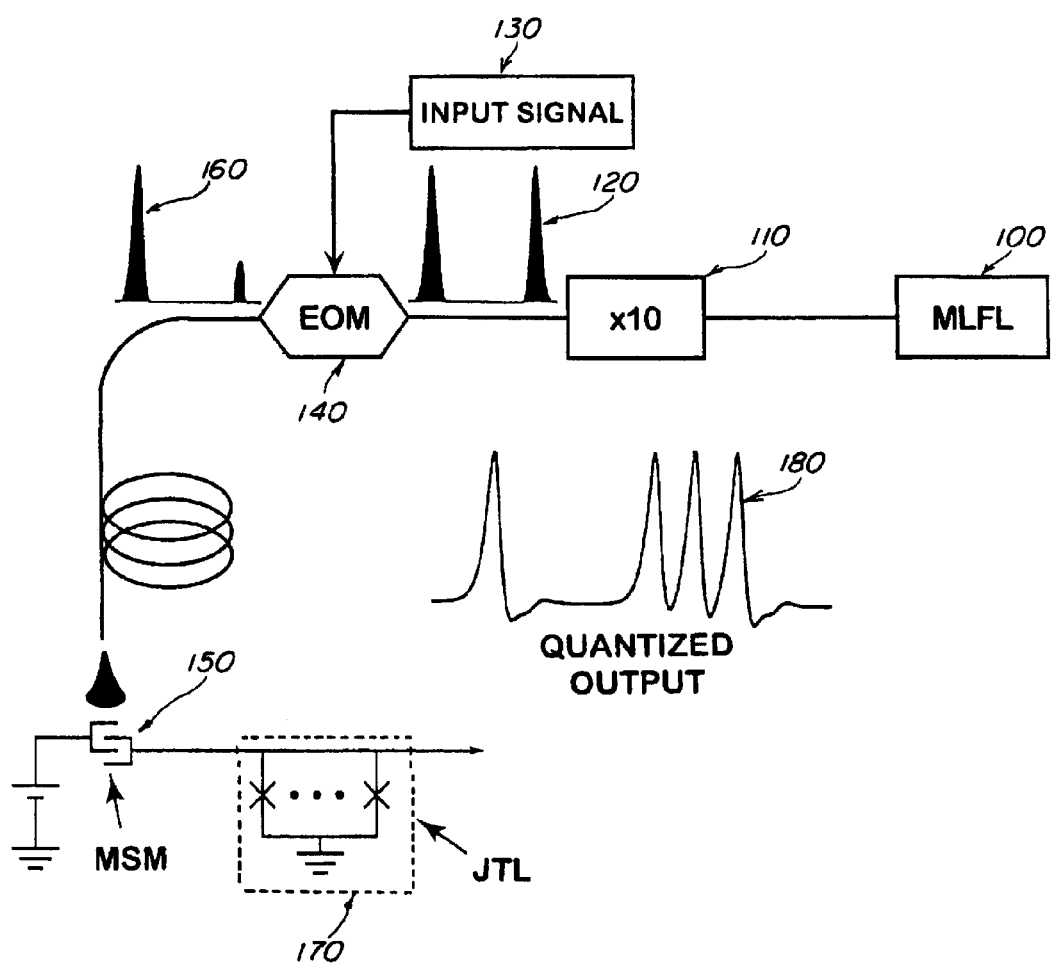
FIG. 1 shows a general diagram of the hybrid photonic digital to analog converter

A schematic block diagram is shown in FIG. 1 of the hybrid analog-to-digital converter (ADC) system combining photonic with superconducting electronics. This scheme integrates optical and electronic ADC designs by performing the sampling in the photonic subsystem and the quantization and digital output in the superconducting subsystem. In this scheme a mode-locked fiber laser (MLFL) 100 produces~1 ps pulses, at a repetition rate of 10–20 GHz and is multiplexed to beyond 100 GHz with a pulse rate multiplexor 110. This produces an optical pulse train of picosecond pulses 120 that sample the input electrical signal 130 with an electro-optic modulator 140. The pulse train from the laser is the sampling clock of the converter and its pulse width in the electro-optic modulator 140 controls the aperture window of the sampler. The optical pulse train forming the aperture windows has very low timing jitter by nature of the extremely low phase noise of the laser system, creating a very stable photonic sampler. A high-speed photodetector 150, shown in FIG. 1 as a metal-semiconductor-metal (MSM) photodiode, converts the modulated optical pulse train 160 into an electrical pulse train on a microstrip transmission line. The resistively-shunted Josephson transmission line (JTL) 170 transforms the amplitude modulated input pulses into bursts of single flux quantum (SFQ) pulses 180. The total system has now sampled the waveform and produced a quantized pulsed output.

To complete the converter, the quantized pulses must be converted into a binary output. This is achieved by two different methods: pulse counting or pulse arrival time detection. Methods of counting quantized pulses are used extensively in superconducting ADCs. The most common method is a serial counter,.where a burst of pulses is counted producing a serial binary output. This method, however, is slow since it is time consuming to count 2N values, where N is the number of binary bits. Two faster methods are described here using techniques that save time by employing parallel counting structures; these are parallel parity counter circuits and exclusive OR (XOR) logic counter circuits. Following the two pulse counting methods, a pulse arrival method is shown.

Figure 2A:
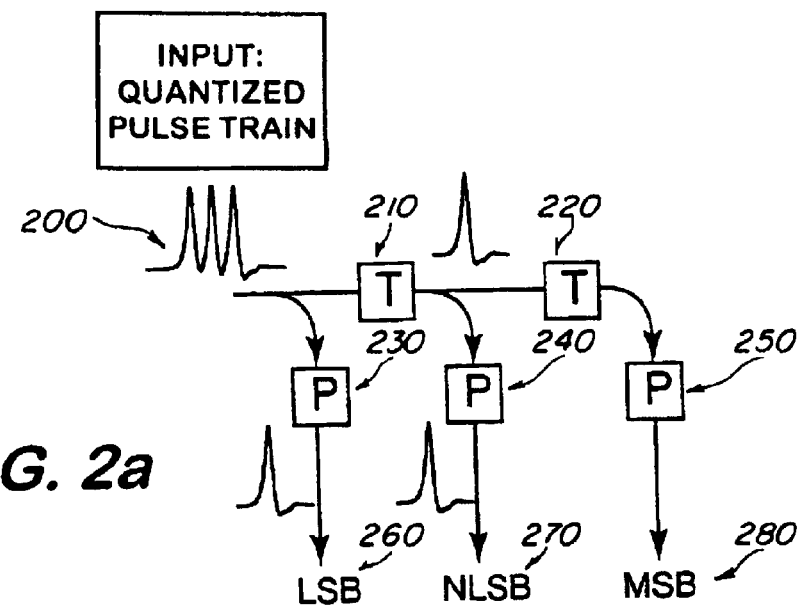
FIG. 2a shows a block diagram of a binary output parallel parity counter circuit
Figure 2B:
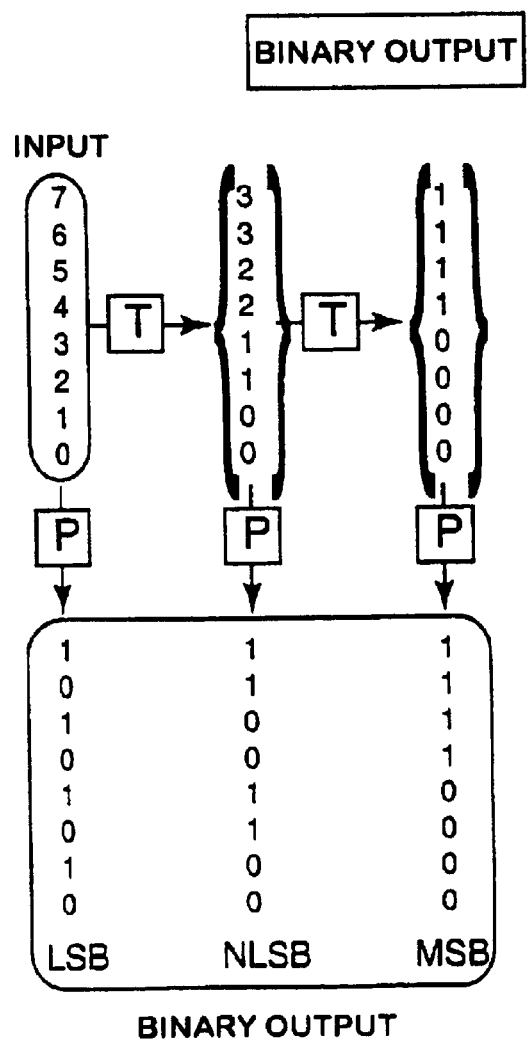
FIG. 2b shows an output sample from the binary output parallel parity counter

One type of counter for binary output is shown in FIG. 2a as a schematic block diagram of a 3-bit binary output, parallel parity counter circuit. Here, the quantized bursts of SFQ pulses 200 (150 in FIG. 1) pulses are input to cascaded toggle (or T) flip-flops 210 and 220 and are interrogated prior to each flip-flop by parity checkers 230, 240, and 250 producing a parallel binary output. The output of the parity elements produces three parallel binary output channels: the least-significant bit (LSB) 260, the next least-significant bit (NLSB) 270, and the most-significant bit (MSB) 280. The data in the circuit is interrogated in the diagram FIG. 2b, where the input is in the upper left corner with eight input levels representing the number of quantized pulses in the circuit. The output of each parity circuit contains one of the parallel binary output channels with the LSB on the left, then the NLSB, and the MSB on the right. This circuit lends itself to high-speed and high-resolution conversion since it performs tasks in parallel. The T flip-flop circuit elements have been shown to operate up to 770 GHz, allowing for conversion rates above 100 gigasamples per second. In addition, by producing a parallel output data stream, there is minimal timing overhead in adding extra bits of resolution.

Figures 3A, 3B:
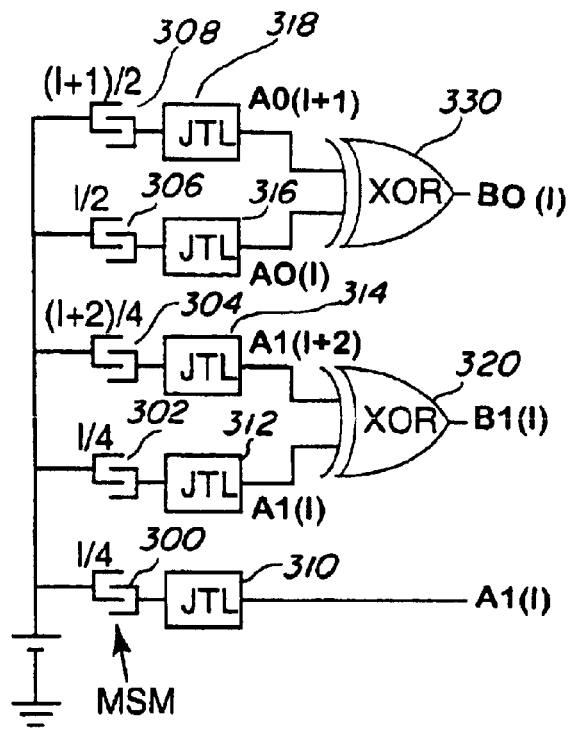
FIG. 3a shows a block diagram of the XOR circuit for a binary output counter
FIG. 3b shows a binary output sample from the XOR binary output counter

Another type of counter for binary output is shown in FIG. 3a as achieving pulse counting in a 3-bit, parallel binary output via an XOR logic counting circuit. Here five parallel optical inputs are supplied to high-speed MSM photodetectors 300, 302, 304, 306, and 308 creating amplitude modulated electrical pulse trains on microstrip transmission lines and then JTL transmission lines 310, 312, 314, 316, and 318 convert the pulse trains into bursts of SFQ pulses. Pairs of pulse trains are compared using XOR logic circuits 320 and 330. Each XOR output produces a single bit of the binary output. The table in FIG. 3b shows the range of input and output values for a 3-bit ADC. The first column represents the range of SFQ pulses produced for the range of optical input power. The next two columns show the resulting SFQ pulse output for an optical power 50% and 25% as large as the first column. This can be achieved by placing an optical or electrical attenuator on a single channel, or by increasing the size of the Josephson junctions in the JTL 170, thereby increasing the input current needed to switch the junctions. The final two columns contain the output after the XOR stages. The last three columns contain the binary output under the headings MSB most significant bit, NLSB next least significant bit, and LSB least significant bit for the binary output counter.

The technique utilizing XOR circuitry shown in FIG. 3a is similar to the parity technique shown in FIG. 2a but contains a few differences. Most importantly, the full-scale range in this system requires only 4 pulses, whereas the parity method needs a total of 7 pulses to achieve the full range. This provides an advantage due to the reduced number circuit operations (i.e. fewer pulses to interrogate).

Figure 4A:
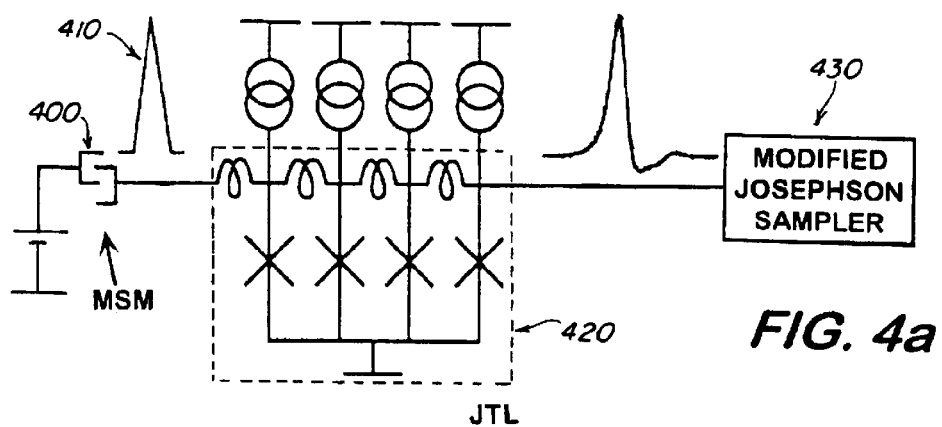
FIG. 4a shows a pulse arrival time detector using a high speed photodetector to convert the amplitude of an optical pulse into a varying arrival time of a SFQ pulse; the arrival time is measured with a modified Josephson sampler to produce a binary output.
Figure 4B:
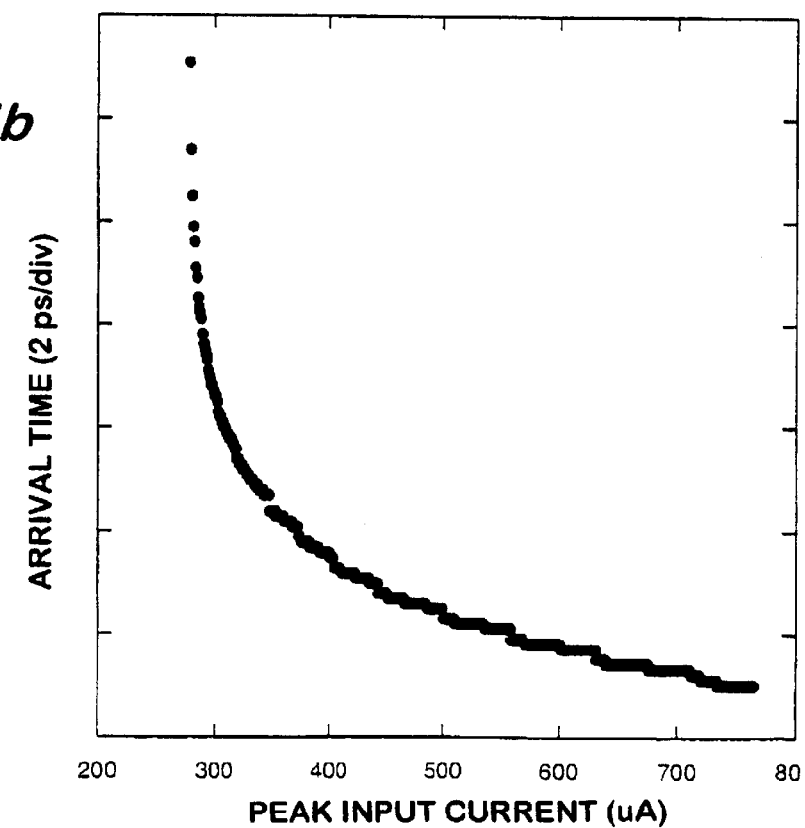
FIG. 4b shows the arrival time of the SFQ pulse decreasing with increasing input pulse current from the high-speed photodetector.

A different technique for converting a quantized pulse into a digital output is shown in FIG. 4a in which one can track the arrival time of the first SFQ pulse produced on a resistively shunted Josephson transmission line JTL as shown in the graph in FIG. 4b. This method takes advantage of a mapping between excitation amplitude and arrival time of a SFQ pulse following a JTL. FIG. 4a shows a schematic diagram of the circuit diagram where a high-speed photodetector 400 converts an optical pulse to an electrical pulse 410. The electrical pulse 410 is coupled into a JTL 420 consisting of four resistively-shunted Josephson junctions.

For the data shown, the McCumber parameter was 1.71 with a junction critical current Ic=240 uA, a shunt resistance Rs=2 ohms, and a coupling inductor L=2 pH. The junctions were biased at 0.71·Ic. The plot shows that as the input current increases the arrival time of the SFQ pulse decreases. To measure the arrival time of the pulse a modified Josephson sampler 430 can be used to detect the arrival time. The Faris pulser circuit in the traditional Josephson sampler can be removed in this instance since an optoelectronic pulse generator is used. This removes jitter associated with the pulser and reduces the intrinsic response of the sampler to 0.1-ps. Using the data from FIG. 4 with a 0.5-ps resolution sampler, 24 discrete levels could be formed comprising a greater than 4-bit resolution converter. The nonlinear transfer function from input amplitude to pulse arrival time can be linearized by adjusting the timing of the Josephson sampler circuit. A resolution of 4 bits requires only 16 levels, thus, the previous 24 levels are reduced to 16 and their timing is changed to linearize the output. Digital post processing can also perform this linearization.

Utilizing the superconducting electronics not only to sample the data, but also to quantize and assemble the binary output, the complexity is reduced compared to the traditional photonic or superconducting ADCs. In the case of superconducting ADCs, the electrical current input from :the optoelectronic switch feeds naturally into the JJ electronics, as opposed to traditional voltage inputs. Also, utilizing the flux quantization of the superconductor removes resistor ladder networks used in some superconducting ADCs, thereby reducing electrical and thermal power (while potentially increasing circuit margins).

Subpicojoule input optical energies are needed to produce electrical current transients sufficient to switch the superconducting electronics. A detector with a poor external quantum efficiency of 0.2, could produce a 5-ps-wide, 1.0-mA-peak current pulse from a 20-fJ optical pulse. When operating at 100 GHz, this means a total optical power level of 2 mW. This is a very small power compared with current photonic ADC designs.

In summary, this photonic/superconducting hybrid system is a simple design with a small number of components. The lack of complex electronic circuitry allows for much higher speed operation, which has been shown to operate into the hundreds of gigahertz regime. The photonic system contributes its extremely low clock jitter, good amplitude stability, and picosecond sampling aperture window. The superconducting electronics offer magnetic flux quantization of pulses and high-speed digital logic to complete the hybrid ADC system. Both the optical and superconducting power requirements are lower than an ADC comprised solely of either superconducting electronics or photonic. The future of superconducting electronics in which SFQ pulse durations decrease will directly improve the system's operational speed. Since the maximum data rate exceeds the capabilities of current digital signal processing, the ADC could sacrifice some of its speed for improved resolution by placing it in a more complex, e.g. subranging, ADC architecture.

Although this invention has been described in relation to an exemplary embodiment thereof, it will be understood by those skilled in the art that still other variation and modifications can be affected in the preferred embodiment without detracting from the scope and spirit of the invention as described in the claims.

What is claimed:

1. A hybrid photonic analog to digital converter comprising:
   a laser with an optical pulse train forming a sampling clock for sampling an input electrical signal;
   a modulator connected to said laser using said optical pulse train for sampling said input electrical signal;
   a high speed photodetector connected to said modulator for converting said optical pulse train into an electrical pulse train;
   a Josephson transmission line connected to said high speed photodetector for transforming said electrical pulse train into bursts of quantized pulses; and
   a parallel parity counter for converting said quantized pulses into a binary output.

2. The hybrid photonic analog to digital converter of claim 1, wherein said laser is a mode locked fiber laser.

3. The hybrid photonic analog to digital converter of claim 1, wherein said high speed photodetector is a metal semiconductor metal photodiode.

4. The hybrid photonic analog to digital converter of claim 1, wherein the parallel parity counter is a 3 bit binary output parallel parity counter circuit.

5. A hybrid photonic analog to digital converter comprising:
   a laser with an optical pulse train forming a sampling clock for sampling an input electrical signal;
   a modulator connected to said laser using said optical pulse train for sampling said input electrical signal;
   a high speed photodetector connected to said modulator for converting said optical pulse train into an electrical pulse train;
   a Josephson transmission line connected to said high speed photodetector for transforming said electrical pulse train into bursts of quantized pulses; and
   an exclusive OR logic counter circuit for converting said quantized pulses into a binary output.

6. The hybrid photonic analog to digital converter of claim 5, wherein said laser is a mode locked fiber laser.

7. The hybrid photonic analog to digital converter of claim 5, wherein said high speed photodetector is a metal semiconductor metal photodiode.

8. The hybrid photonic analog to digital converter of claim 5, wherein the exclusive OR logic counter circuit is a 3 bit XOR logic counting circuit.

9. A hybrid photonic analog to digital converter comprising:
   a laser with an optical pulse train forming a sampling clock for sampling an input electrical signal;
   a modulator connected to said laser using said optical pulse train for sampling said input electrical signal;
   a high speed photodetector connected to said modulator for converting said optical pulse train into an electrical pulse train;
   a Josephson transmission line connected to said high speed photodetector for transforming said electrical pulse train into quantized pulses; and
   a pulse arrival time detection circuit for converting arrival times of the quantized pulses into a digital output.

10. The hybrid analog to digital converter of claim 9, wherein said laser is a mode locked fiber laser.

11. The hybrid photonic analog to digital converter of claim 9, wherein said high speed photodetector is a metal semiconductor metal photodiode.

12. The hybrid photonic analog to digital converter of claim 9, wherein said pulse arrival time detection circuit comprises a modified Josephson sampling circuit to convert arrival times of the quantized pulses into a digital output.

* * * * *